(12) United States Patent
Roh

(10) Patent No.: US 6,423,610 B1
(45) Date of Patent: Jul. 23, 2002

(54) METHOD FOR FORMING INNER CAPACITOR OF SEMICONDUCTOR DEVICES USING OXIDE LAYERS FORMED THROUGH A PLURALITY OF RADIALLY-ARRANGED INJECTING HOLES OF A SACVD EQUIPMENT SHOWERHEAD

(75) Inventor: Jai-Sun Roh, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/927,535

(22) Filed: Aug. 13, 2001

(30) Foreign Application Priority Data

Oct. 4, 2000 (KR) ............................................. 00-58275

(51) Int. Cl.[7] ............................................. H01L 21/20
(52) U.S. Cl. ....................... 438/396; 438/239; 438/514; 438/513
(58) Field of Search ................................ 438/396–399, 438/313, 325, 239, 245, 255, 256, 259–262, 435, 424, 514, 513

(56) References Cited

U.S. PATENT DOCUMENTS 6,037,220 A  * 3/2000 Chien et al. ................. 438/255
6,174,808 B1 * 1/2001 Jang et al. ................... 438/680

* cited by examiner

Primary Examiner—Olik Chaudhuri
Assistant Examiner—Yennhu B. Huynh
(74) Attorney, Agent, or Firm—Jacobson Holman, PLLC

(57) ABSTRACT

A method for forming an inner capacitor of a semiconductor device. The method comprises steps of forming an interlayer insulation layer over a semiconductor substrate, wherein a plurality of layers to form semiconductor transistors are formed on the semiconductor substrate; forming a SACVD oxide layer on the interlayer insulation layer; forming contact holes for charge storage electrodes and bit lines by selectively etching the SACVD oxide layer and the interlayer insulation layer; forming contact plugs in the contact holes, thereby forming a resulting structure; forming a SACVD sacrifice oxide layer on the resulting structure; selectively etching the SACVD sacrifice oxide layer and exposing top surfaces of the contact plugs; forming a conducting layer electrically connected to the contact plugs; separating the conducting layer into a plurality of charge storage electrodes; and removing the SACVD sacrifice oxide layer.

13 Claims, 5 Drawing Sheets

US 6,423,610 B1

METHOD FOR FORMING INNER CAPACITOR OF SEMICONDUCTOR DEVICES USING OXIDE LAYERS FORMED THROUGH A PLURALITY OF RADIALLY-ARRANGED INJECTING HOLES OF A SACVD EQUIPMENT SHOWERHEAD

FIELD OF THE INVENTION

The present invention relates to a method for forming a semiconductor device and, more particularly, to a method for forming an inner capacitor of the semiconductor device.

DESCRIPTION OF THE PRIOR ART

FIG. 1 is a cross-sectional view illustrating a conventional inner capacitor in a semiconductor device. As shown in FIG. 1, after forming field oxide layers 11, source/drain regions 12, word lines 13 and bit lines 16 in and on a semiconductor substrate 10, a BPSG (Borophosphosilicate Glass) layer 18, a $SiH_4$-oxide layer 20 and a nitride layer 21 are deposited on the resulting structure. A planarization process is applied to the BPSG layer 18 with a flow and CMP (Chemical Mechanical Polishing) processes. Typically, the nitride layer 21 is employed as an etching stopper and the $SiH_4$-oxide layer 20 is employed to prevent the bowing phenomenon generated in sidewalls of a contact hole. In FIG. 1, the reference numerals 14, 15 and 17 denote sidewall spacers of the word lines, a BPSG layer and sidewall spacers of the bit lines, respectively.

Subsequently, after forming contact holes for charge storage electrodes using masking and etching processes, a clearing process is carried out and polysilicon contact plugs 19 are formed within the contact holes. Typically, contact plugs for the bit lines are defined simultaneously with the polysilicon contact plugs for charge storage electrodes.

Next, a PSG (phosphosilicate glass) layer 22, as a sacrifice oxide layer, is deposited on the resulting structure and the PSG layer 22 is selectively etched in order to expose the polysilicon contact plugs 19. A polysilicon layer 23 is formed in the contact holes for charge storage electrodes. The single polysilicon layer 23 is divided into a plurality of charge storage electrodes by the CMP process and a relatively wide surface area of charge storage electrodes is provided by the removal of the remaining PSG layer 22.

In the conventional method for forming the inner capacitor, the PSG layer 22 used as a sacrifice oxide layer is formed in the APCVD (Atmospheric Pressure Chemical Vapor Deposition) equipment having an injector 200, which is in the form of a bar, as shown in FIG. 2. The injector 200 has 49 injecting holes 201 which are arranged in a straight line. Since the PSG layer 22 is deposited on the semiconductor substrate mounted on a moving belt by the typical two-pass process while a source gas flows from the injecting holes 201, there are some areas 301 vulnerable to the thickness uniformity of the PSG layer 22 as shown in FIG. 3. In FIG. 3, the reference numeral 300 denotes a uniform thickness area. In the case where the PSG layer 22 is deposited at a thickness of approximately 11000 Å, the PSG layer 22 has a non-uniformity of about 5%.

FIG. 4 is a schematic layout showing a charge storage electrode contact and a bit line contact, in which a charge storage electrode contact area 401, a bit line contact area 402 and a charge storage electrode area 403 are shown. When the PSG layer 22 is etched to expose the polysilicon layer 23 for the charge storage electrodes, the nitride layer 21 and the BPSG layer 18 may be etched in the area 301 because of the non-uniformity of thickness of the PSG layer 22.

Accordingly, this loss of the nitride layer 21 and the BPSG layer 18 causes an electrical interconnection (A) between the polysilicon layer 23 for the charge storage electrode and a bit line contact plug.

The loss of the BPSG layer 18 is caused by the loss of the nitride layer 21 and the $SiH_4$-oxide layer 20. The $SiH_4$-oxide layer 20 is formed on the BPSG layer 18 at a thickness of approximately 500–2000 Å in order to prevent the bowing phenomenon in sidewalls of the contact holes, because the $SiH_4$-oxide layer 20 is hardly etched by a clearing solution that is applied to the contact holes. Typically, since the $SiH_4$-oxide layer 20 is formed in a bulk layer by the PECVD (Plasma Enhanced CVD) processing chamber, the quality of the layer is not rigid and then the $SiH_4$-oxide layer 20 may be lost with a loss of the upper layer.

As stated above, the method for forming the conventional inner capacitor has a disadvantage in that the loss of the BPSG layer, the nitride layer and the $SiH_4$-oxide layer under the sacrifice oxide layer (PSG) layer may occur based on the non-uniformity of thickness of the PSG layer thereon. Accordingly, this loss may cause a short between adjacent metal layers with a resulting failure of the semiconductor device.

SUMMARY OF THE INVENTION

It is, therefore, an object of the present invention to provide a method for improving the reliability of the semiconductor fabricating process which uses a sacrifice oxide layer.

It is another object of the present invention to provide a method for preventing short circuiting of a charge storage electrode in a semiconductor memory device.

In accordance with an aspect of the present invention, there is provided a method for forming a charge storage electrode in a semiconductor device, the method comprising the steps of forming an interlayer insulation layer over a semiconductor substrate, wherein a plurality of layers to form semiconductor transistors are formed on the semiconductor substrate; forming a SACVD oxide layer on the interlayer insulation layer; forming contact holes for charge storage electrodes and bit lines by selectively etching the SACVD oxide layer and the interlayer insulation layer; forming contact plugs in the contact holes, thereby forming a resulting structure; forming a SACVD sacrifice oxide layer on the resulting structure; selectively etching the SACVD sacrifice oxide layer and exposing top surfaces of the contact plugs; forming a conducting layer electrically connected to the contact plugs; separating the conducting layer into a plurality of charge storage electrodes; and removing the SACVD sacrifice oxide layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, an embodiment of the present invention will be described in detail with reference to the accompanying drawings.

Figure 1:
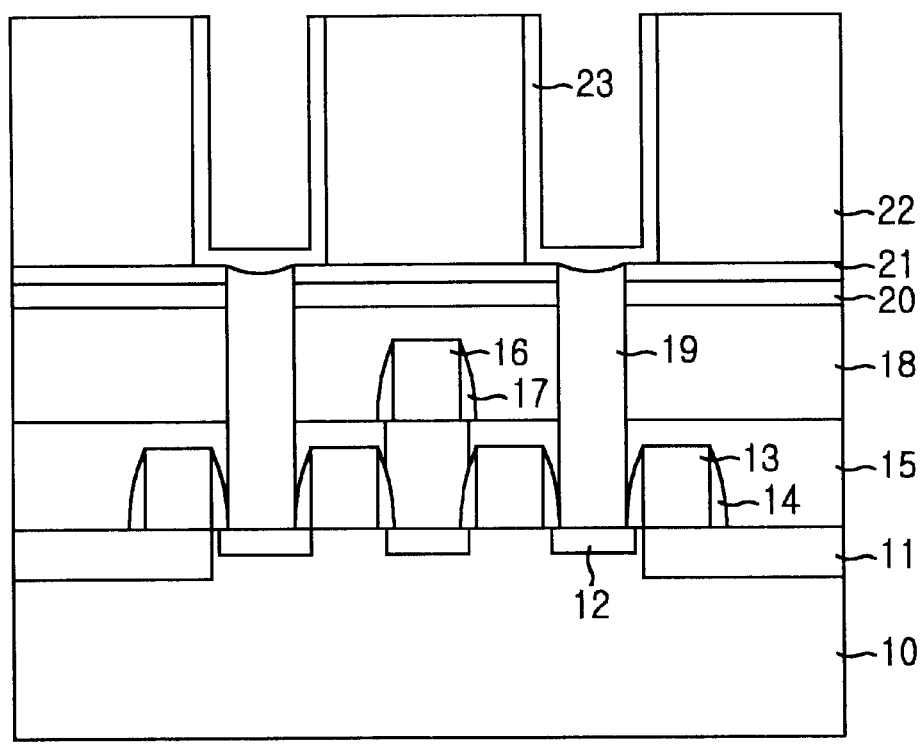
FIG. 1 is a cross-sectional view illustrating a conventional inner capacitor in a semiconductor device.
Figure 2:
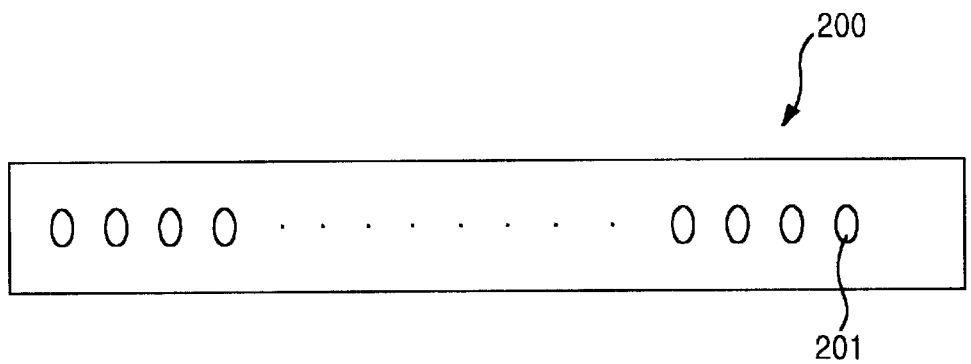
FIG. 2 is a top view of an injector in APCVD equipment according to the prior art.
Figure 3:
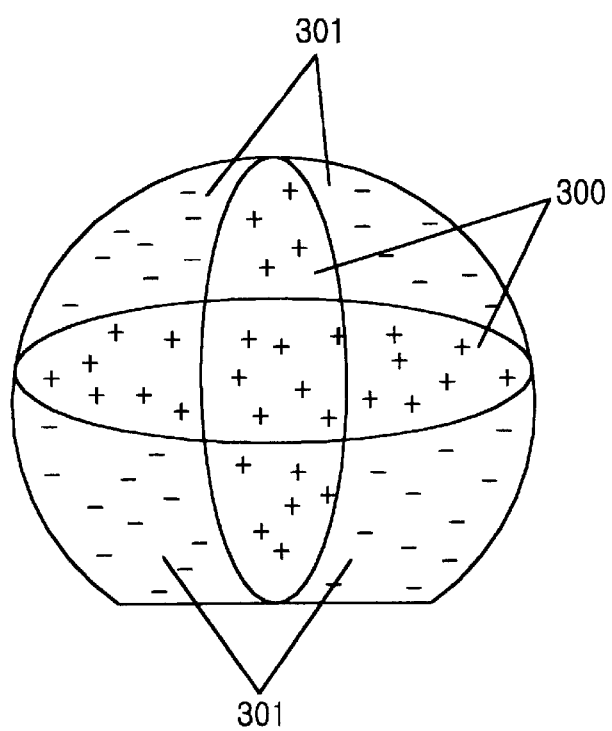
FIG. 3 is a top view showing a wafer on which a PSG layer is deposited according to the prior art.
Figure 4:
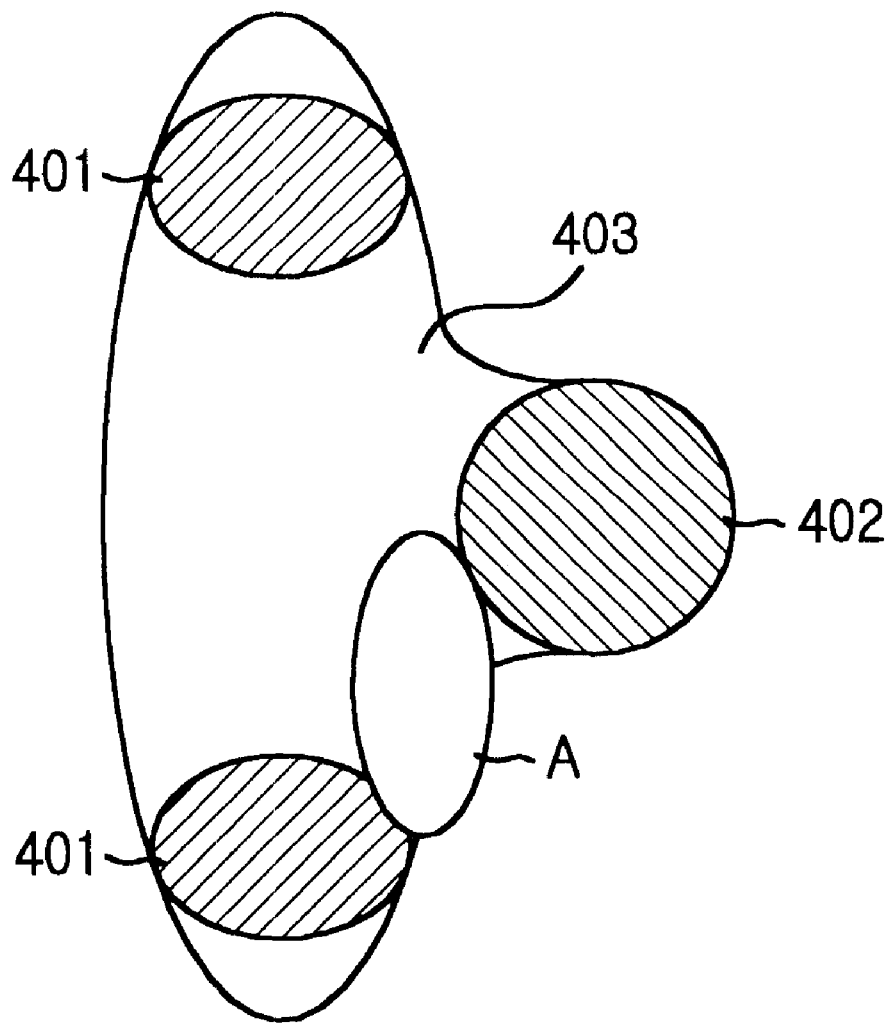
FIG. 4 is a schematic layout showing a charge storage electrode contact and a bit line contact according to the prior art.
Figure 5:
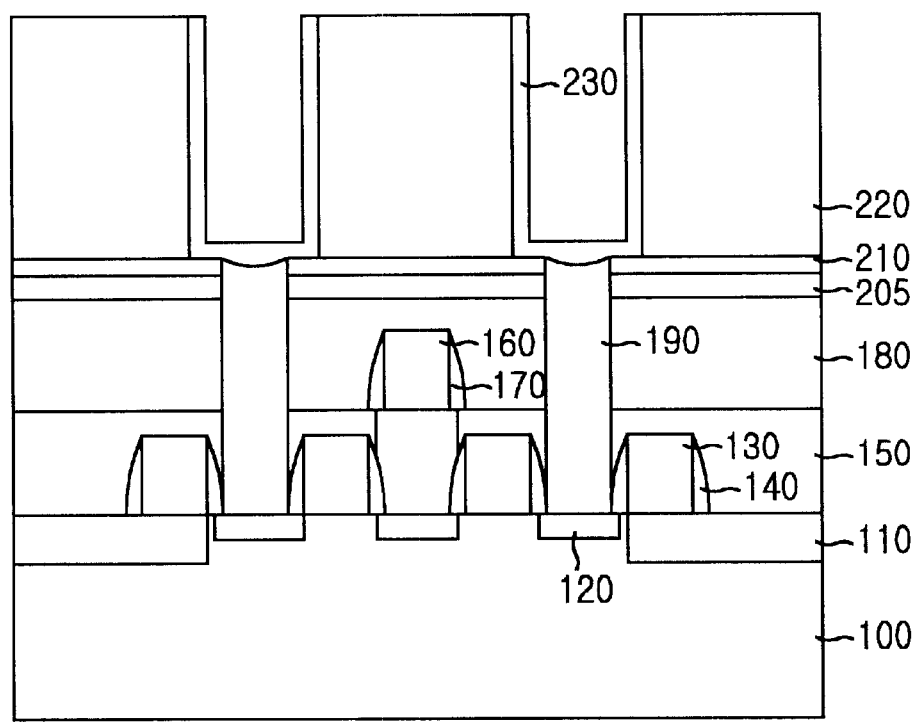
FIG. 5 is a cross-sectional view illustrating an inner capacitor in a semiconductor device according to the present invention.

First, FIG. 5 has the same inner capacitor structure as shown in FIG. 1 and the same processes as have already been described are also applicable to form an inner capacitor.

Referring to FIG. 5, field-oxide layers 110, source/drain regions 120, word lines 130 and bit lines 160 are formed in and on a semiconductor substrate 100 and a BPSG (Borophosphosilicate Glass) layer 180 is deposited on the resulting structure. A planarization process is applied to the BPSG layer 180 with a flow process and a CMP process. An oxide layer 205, such as an USG (undoped-silicate glass) layer, for preventing the bowing phenomenon generated in sidewalls of a contact hole is formed on the BPSG layer 180 by the SACVD (Sub-Atmospheric CVD) method and a nitride layer 210 is formed on the oxide layer 205. The oxide layer 205 formed by the SACVD method has a thickness of approximately 500–2000 Å. Further, to increase the density of the oxide layer 205, an additional thermal treatment may be carried out.

The nitride layer 210 is employed as an etching stopper and the reference numerals 140, 150 and 170 denote sidewall spacers of the word lines, a BPSG layer and sidewall spacers of the bit lines, respectively.

Subsequently, after forming contact holes for charge storage electrodes using masking and etching processes, a clearing process is carried out and polysilicon contact plugs 190 are formed within the contact holes; contact plugs for the bit lines may be defined simultaneously with the polysilicon contact plugs 190 for charge storage electrodes. Next, a PSG (phosphosilicate glass) layer 220, as a sacrifice oxide layer, is deposited on the resulting structure and the PSG layer 220 is selectively etched in order to expose the polysilicon contact plugs 190. A polysilicon layer 230 is formed in the contact holes for charge storage electrodes. The single polysilicon layer 230 is divided into a plurality of charge storage electrodes by the CMP process and a relatively wide surface area of charge storage electrodes is provided by the removal of the PSG layer 220.

Unlike the prior art, the PSG layer 220, a sacrifice oxide layer, is formed by the SACVD (Sub-Atmospheric CVD) method and has a thickness of approximately 500–2000 Å. The detailed formulas for forming the PSG layer 220 in accordance with the present invention are as follows:

Flow rate of He: 10000–14000 sccm;

Flow rate of $O_3$: 10000–14000 sccm;

Flow rate of TEOS(tetraethylorthosilicate): 900–1500 mg/m;

Flow rate of TEPO: 30–80 mg/m;

Temperature: 400–480° C.; and

Pressure: 100–300 Torr.

As stated above, the oxide layer 205 and the PSG layer 220 according to the present invention are formed by the SACVD method and then the uniformity of the PSG layer 220 may be controlled to be below 1%. In the case of the APCVD method for forming the conventional inner capacitor, the PSG layer in FIG. 1 is formed by the injection of a reactant gas produced by bubbling source gases, such as TEOS and TMPi (trimethylphosphate), with $N_2$ gas and then is formed by a heterogeneous reaction. Therefore, it is very difficult to obtain a uniform thickness throughout the PSG layer.

In the present invention, TEOS and TMPo (trimethylborate) are used as a source gas for the PSG layer 220 and a showerhead is used instead of bubbling $N_2$ gas. That is, the source gases are pre-mixed before the injection through the showerhead and thereafter the mixed gases are injected into the wafer so as to form the PSG layer 220. Also, the deposition temperature is in a range of about 400° C. to 480° C. and this temperature is lower than the 530° C. required in the APCVD method. Accordingly, the SACVD method has an effect on the thermal budget required to form the PSG layer 220.

Figure 6:
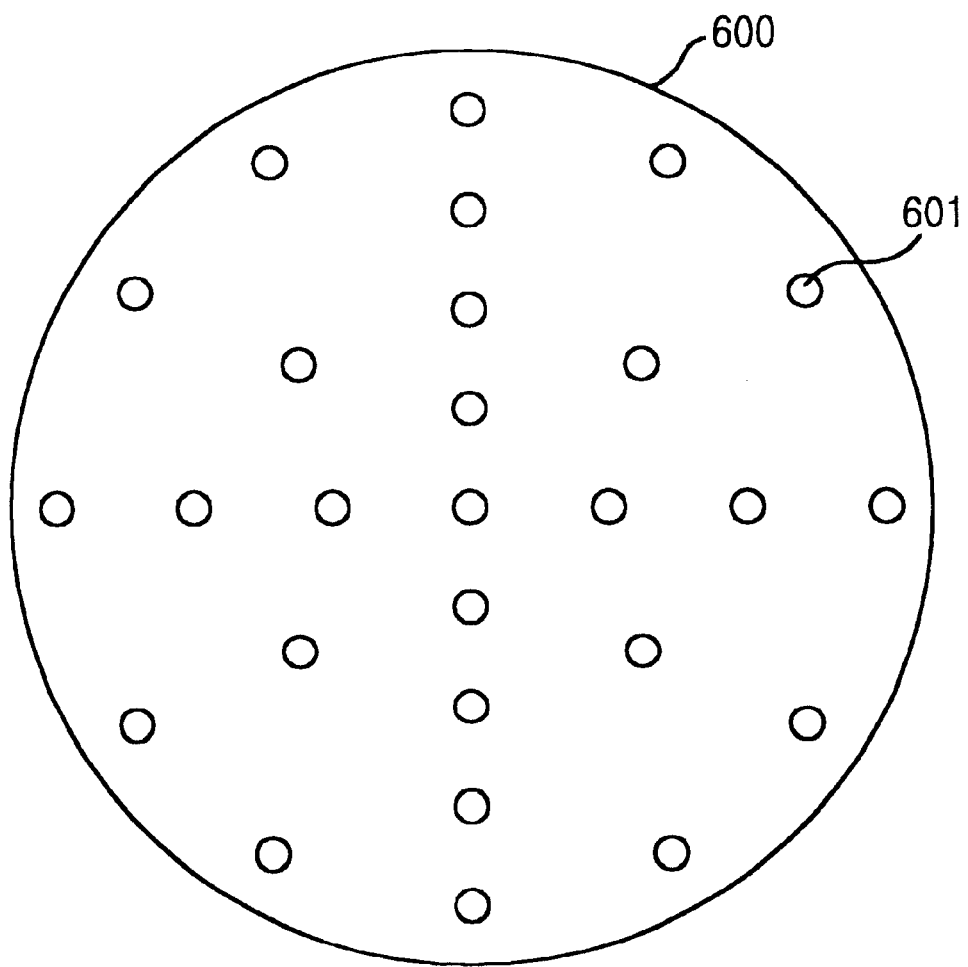
FIG. 6 is a top view of a showerhead on SACVD (Sub-Atmospheric CVD) equipment.

FIG. 6 is a top view of the showerhead on the SACVD equipment. The showerhead 600 has a plurality of injecting holes 601 evenly arranged in a radial manner so that the showerhead does not have an arrangement that might negatively impact the thickness uniformity of the PSG layer.

Furthermore, since there is no interface within the oxide layer 205 formed by the SACVD method, it has solid density twice as high as the $SiH_4$-oxide layer formed by the PECVD method so that the loss of the lower layers of the oxide layer 205 may be prevented.

As apparent from the above, the present invention prevents the loss of the interlayer insulation layer, such as a BPSG layer, by improving the thickness uniformity of the PSG layer used as a sacrifice oxide layer, especially in semiconductor capacitor fabricating processes. Accordingly, the present invention prevents short circuiting between adjacent metal layers and thus increase the yield of the semiconductor devices.

Although the preferred embodiments of the present invention have been disclosed for illustrative purpose, those skilled in the art will appreciate that various modifications, additions and substitutes are possible, without departing from the scope and spirit of the present invention as described in the accompanying claims.

What is claimed is:

1. A method for forming a charge storage electrode in a semiconductor device, the method comprising steps of:

forming an interlayer insulation layer over a semiconductor substrate, wherein a plurality of layers to form semiconductor transistors are formed on the semiconductor substrate;

forming a SACVD oxide layer on the interlayer insulation layer by injecting a pre-mixed source gas through a plurality of radially-arranged injecting holes of a SACVD equipment showerhead;

forming contact holes for charge storage electrodes and bit lines by selectively etching the SACVD oxide layer and the interlayer insulation layer;

forming contact plugs in the contact holes, thereby forming a resulting structure;

forming a SACVD sacrifice oxide layer on the resulting structure;

selectively etching the SACVD sacrifice oxide layer and exposing top surfaces of the contact plugs;

forming a conducting layer electrically connected to the contact plugs;

separating the conducting layer into a plurality of charge storage electrodes; and removing the SACVD sacrifice oxide layer.

2. The method as recited in claim 1, further comprising a step of applying a thermal treatment to the SACVD oxide layer in order to increase a density thereof.

3. The method as recited in claim 1, further comprising a step of forming a nitride layer on the SACVD oxide layer.

4. The method as recited in claim 1, wherein the SACVD oxide layer is a PSG (phosphosilicate glass) layer.

5. The method as recited in claim 4, wherein the PSG layer is formed by a SACVD equipment which includes a source gas injector having a plurality of injecting holes evenly arranged in a radial manner.

6. The method as recited in claim 5, wherein the PSG layer is formed by a mixed gas of He, $O_3$, TEOS (tetraethylorthosilicate) and TMPo (trimethylborate).

7. The method as recited in claim 6, wherein a flow rate of each of He, $O_3$, TEOS and TMPO is 10000–14000 sccm, 6000–10000 sccm, 900–1500 mg/m and 30–80 mg/m.

8. The method as recited in claim 6, wherein the PSG layer is formed at a temperature of approximately 400–480° C. and at a pressure of approximately 100–300 Torr.

9. The method as recited in claim 1, wherein the SACVD oxide layer is formed at a thickness of approximately 500–2000 Å.

10. The method as recited in claim 1, wherein the step of forming said SACVD oxide layer is performed at a temperature of approximately 400–480° C. and at a pressure of approximately 100–300 Torr.

11. The method as recited in claim 1, wherein said pre-mixed source gas includes TEOS and TMPO.

12. The method as recited in claim 11, further comprising He and $O_3$.

13. The method as recited in claim 12, wherein a flow rate of each of He, $O_3$, TEOS and TMPO is 10000–14000 sccm, 6000–10000 sccm, 900–1500 mg/m and 30–80 mg/m.

* * * * *